United States Patent [19]

Kobayashi et al.

[11] Patent Number: 4,824,762

[45] Date of Patent: Apr. 25, 1989

[54] METHOD FOR RINSE TREATMENT OF A SUBSTRATE

[75] Inventors: Masakazu Kobayashi, Kawasaki; Shingo Asaumi, Fujisawa; Hatsuyuki Tanaka, Samukawa, all of Japan

[73] Assignee: Tokyo Ohka Kogyo Co., Ltd., Kawasaki, Japan

[21] Appl. No.: 67,313

[22] Filed: Jun. 26, 1987

[30] Foreign Application Priority Data

Jul. 18, 1986 [JP] Japan .................................. 61-167898

[51] Int. Cl.$^4$ .......................... G03C 11/12; G03C 5/00
[52] U.S. Cl. .................................... 430/258; 430/256; 430/325; 430/329; 430/331; 430/432; 430/463; 252/171
[58] Field of Search ............... 430/325, 331, 463, 432, 430/256, 258, 329; 252/171

[56] References Cited

U.S. PATENT DOCUMENTS

| | | | |
|---|---|---|---|
| 3,988,256 | 10/1976 | Vandermey et al. | 430/432 |
| 4,276,186 | 6/1981 | Bakos et al. | 252/171 |
| 4,395,479 | 7/1983 | Ward et al. | 430/258 |
| 4,535,054 | 8/1985 | Brault et al. | 430/325 |
| 4,617,251 | 10/1986 | Sizensky | 430/331 |
| 4,744,834 | 5/1988 | Haq | 134/38 |

FOREIGN PATENT DOCUMENTS 3501675 7/1986 Fed. Rep. of Germany .
31528 2/1983 Japan .

Primary Examiner—Paul R. Michl
Assistant Examiner—Mark R. Buscher
Attorney, Agent, or Firm—Hopgood, Calimafde, Kalil, Blaustein & Judlowe

[57] ABSTRACT

The improvement of the invention consists in the use of a specific ether compound, e.g., diethyleneglycol monomethyl, monoethyl and monobutyl ethers, dipropyleneglycol monomethyl and monoethyl ethers, triethyleneglycol monomethyl and monoethyl ethers and tripropyleneglycol monomethyl ether, as a rinse solvent for a substrate from which the pattern photoresist layer has been removed with a remover solution in the photolithographic processing of semiconductor devices. The rinse solvent is free from the problems in the toxicity to human body and environment pollution relative to waste disposal as well as the danger of fire. The rinse solvent is versatile to be applicable to both of the negative- and positive-working photoresist compositions. Further advantages are obtained by adding an aliphatic amine compound to the rinse solvent.

6 Claims, No Drawings

METHOD FOR RINSE TREATMENT OF A SUBSTRATE

BACKGROUND OF THE INVENTION

The present invention relates to a method for rinse treatment of a substrate or, more particularly, relates to a method, in the manufacturing process of various semiconductor devices, for rinse treatment of a substrate from which the patterned resist layer has been removed by using a remover solution following a photolithographic etching treatment with the patterned resist layer as a mask, using a specific solvent as the rinse liquid not only having excellent effect of rinse but also free from disadvantages in the toxicity to human bodies, environmental pollution in connection with waste disposal and danger of fire.

As is known, the manufacturing process of semiconductor devices such as ICs, LSIs and the like is typically performed in a series of steps including: formation of a thin oxide film on the surface of a substrate such as a semiconductor silicon wafer; formation of a photosensitive layer by uniformly coating the substrate surface with a photoresist composition; formation of a patterned resist layer by pattern-wise exposure of the photoresist layer to light followed by a development treatment; etching treatment of the underlying oxide film pattern-wise with the patterned photoresist layer as a mask; and complete removal of the photoresist layer from the substrate surface.

The removal of the patterned photoresist layer in the last mentioned step is usually performed by using a remover solution which is an aqueous solution of an inorganic acid or base or an organic solvent capable of dissolving the photoresist layer. Among these conventional remover solutions, organic solvents are usually preferred because danger to workers is involved in the use of an inorganic acid or base as the effective ingredient of the remover solutions. Exemplary of the organic solvents conventionally used as a remover of the patterned photoresist layer are alkylbenzene sulfonic acids, mixtures of an aromatic hydrocarbon solvent and an alkylbenzene sulfonic acid and the like.

It is of course that, when the patterned photoresist layer has been dissolved away by using an organic solvent as the remover, the substrate surface must be completely freed from the remover. Since the remover on the substrate surface more or less contains the photoresist composition dissolved therein, the substrate from which the patterned resist layer has been removed away by using an organic solvent cannot be directly transferred to a rinse treatment with water in order to avoid precipitation of the photoresist composition in the remover solvent admixed with water to be deposited again on to the substrate surface. Therefore, it is essential that the substrate from which the patterned photoresist layer has been removed by using an organic solvent as the remover should be rinsed, prior to rinse with water, with an organic solvent.

Conventional organic solvents used for the rinse treatment include trichloroethylene, methyl alcohol, isopropyl alcohol, acetone, methyl ethyl ketone and the like.

Although these organic solvents are indeed effective as a rinse solvent to remove the remover from the substrate surface, they are not free from various disadvantages and problems. For example, trichloroethylene and other halogenated hydrocarbon solvents are disadvantageous in respect of the toxicity to human body and the problem of environmental pollution as are the very serious issues in recent years. Other solvents are also not free from several disadvantages since they are usually inflammable with a relatively low flash point to cause problems in the danger of fire and storage. They are sometimes responsible for the contamination of working environments as a result of their relatively large velocity of vaporization. While trichloroethylene is useful as a rinse solvent for negative-working rubber-based photoresist compositions, it cannot be used for positive-working novolac-based photoresist compositions, for which organic solvents other than trichloroethylene must be used. Accordingly, the rinse solvent must be replaced with another when the working type of the photoresist composition under treatment is changed from negative- to positive-working or vice versa to cause a great decrease in the working efficiency.

SUMMARY OF THE INVENTION

The present invention accordingly has an object to provide a novel and improved method for the rinse treatment of a substrate after removal of the patterned photoresist layer with a remover by use of a specific rinse solvent which can exhibit excellent effect of rinse irrespective of the working type of the photoresist composition with no or very little problems in the toxicity to human body and environmental pollution relative to the waste disposal as well as danger of fire.

Thus, the improvement provided by the present invention comprises, in a rinse treatment of a substrate from which a patterned photoresist layer has been removed with a remover by using a rinse solvent, using, as the rinse solvent, a solvent which is or is mainly composed of an ether compound represented by the general formula

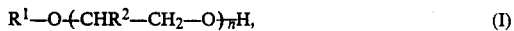

$$R^1-O-(CHR^2-CH_2-O)_nH, \qquad (I)$$

in which $R^1$ is an alkyl group having 1 to 4 carbon atoms, $R^2$ is a hydrogen atom or a methyl group and n is 2 or 3.

DETAILED DESCRIPTION OF THE PREFERRED EMBODIMENTS

As is understood from the above given summary of the invention, the essential feature of the improvement in the inventive method consists in the use of a specific ether compound as the principal component of the rinse solvent. The ether compound represented by the general formula (I) is exemplified by diethyleneglycol monomethyl ether, diethyleneglycol monobutyl ether, diethyleneglycol monoethyl ether, dipropyleneglycol monomethyl ether, dipropyleneglycol monoethyl ether, triethyleneglycol monomethyl ether, triethyleneglycol monoethyl ether, tripropyleneglycol monomethyl ether and the like. These ether compounds can be used either singly or as a mixture of two kinds or more according to need.

Although the desired effect of rinse may be fully exhibited even by using one or a mixture of two kinds or more of the above named ether compounds alone, it is sometimes more advantageous that the rinse solvent is admixed with an aliphatic amine compound represented by the general formula

$$NR_3^3, \qquad (II)$$

in which each $R^3$ is, independently from the others, a hydrogen atom, alkyl group or hydroxyalkyl group, at least one of the three $R^3$ groups being a hydroxyalkyl group, as an additive. Such an amine compound as an additive in the rinse solvent has an effect to neutralize any acidic matter, such as an alkylbenzene sulfonic acid, contained in the remover adhering to the substrate before the rinse treatment so that the otherwise detrimental influence of the acidic matter on the rinse effect of the ether compound as the principal ingredient of the rinse solvent can be greatly reduced to extend the durability of the rinse solvent with stabilization of the rinsing effect.

The aliphatic amine compound represented by the general formula (II) is exemplified by monoethanol amine, butyl monoethanol amine, ethyl diethanol amine, triisopropanol amine and the like. The amount of such an aliphatic amine compound of the general formula (II) as an additive relative to the ether compound of the general formula (I) as the principal ingredient should preferably not exceed 15:85 by weight when the rinse solvent is to be used for the rinse treatment of a negative-working photoresist composition and 50:50 by weight when the photoresist composition is of the positive-working type. When the amount of the aliphatic amine compound in the rinse solvent exceeds the above mentioned respective upper limit, the effect of rinse by using the rinse solvent may be incomplete although the incompleteness of rinse cannot be detected by visual examination. A convenient method for detecting such incompleteness of rinse is to blow steam at the substrate after the rinse treatment so that the areas from which the patterned photoresist layer has been removed are made visible by the visual examination.

Following is a description of the process for the treatment of a substrate according to the present invention. In the first place, a substrate, such as a silicon wafer on which a thin film of oxide is formed beforehand, is uniformly coated with a photoresist composition in the form of a solution followed by drying to form a photosensitive layer which is then subjected to patterning by pattern-wise exposure to light, development treatment and post-baking to give a patterned photoresist layer. In the next place, the oxide film on the substrate surface is selectively etched with the patterned photoresist layer as a mask and then the patterned photoresist layer is completely dissolved away from the substrate surface by using a remover followed by the rinse treatment to wash away the remover adhering to the surface completely by using the rinse solvent.

To summarize the advantages obtained by the inventive method, any substrate materials after removal of the pattern-wise photoresist layer with a remover can be rinsed efficiently by using a specific rinse solvent which is free from the problems of toxicity against human body and environmental pollution relative to waste disposal as well as the danger of fire. Furthermore, the applicability of the rinse solvent used in the inventive method is not limited by the working type of the photoresist composition so that substrates after removal of the patterned photoresist layer can be rinsed according to the inventive method irrespective of the working type of the photoresist composition which may be negative-working or positive-working.

In the following, the procedure of rinse treatment according to the invention is described in more detail by way of an example.

EXAMPLE

Wafers of semiconductor silicon were coated each with a positive-working photoresist composition (OFPR-800, a product by Tokyo Ohka Kogyo Co.) or a negative-working photoresist composition (OMR-83, a product of the same company, supra) in a thickness of 1 μm as dried and they were subjected to pattern-wise exposure to light and development followed by post-baking at 180° C. for 30 minutes. Thereafter, the patterned photoresist layer on each substrate was removed by dipping for 5 minutes at 120° C. in a commercially available remover solution composed of a chlorinated hydrocarbon solvent and an alkylbenzene sulfonic acid. The substrates were then rinsed with one of the rinse solvents indicated in the table below, rinsed with water and dried on a spinner. The rinse solvents used in these tests included the ether compounds of the general formula (I) without or with admixture of an aliphatic amine compound of the general formula (II) as well as conventional rinse solvents such as trichloroethylene, methyl alcohol, isopropyl alcohol and methyl ethyl ketone. When trichloroethylene was used as the rinse solvent, the substrate rinsed with the solvent was dried as such without rinse with water or the substrate rinsed with trichloroethylene was further rinsed with methyl ethyl ketone by dipping therein and finally rinsed with water before drying. The results of these rinse treatments are shown in the table by the symbols of G and NG for satisfactory and unsatisfactory results of rinse, respectively, as inspected by the procedure mentioned before.

TABLE

| Rinse solvent* | Working type of photoresist composition | |
|---|---|---|
| | Negative | Positive |
| Diethyleneglycol monobutyl ether | G | G |
| Dipropyleneglycol monomethyl ether | G | G |
| Tripropyleneglycol monomethyl ether | G | G |
| 95% Diethyleneglycol monobutyl ether + 5% monoethanol amine | G | G |
| 95% Diethyleneglycol monomethyl ether + 5% butyl monoethanol amine | G | G |
| 90% Tripropyleneglycol monomethyl ether + 10% ethyl diethanol amine | G | G |
| 90% Dipropyleneglycol monomethyl ether + 10% monoethanol amine | G | G |
| 85% Diethyleneglycol monobutyl ether + 15% triisopropanol amine | G | G |
| 70% Diethyleneglycol monobutyl ether + 30% monoethanol amine | NG | G |
| Trichloroethylene | G | NG |
| Methyl alcohol | NG | G |
| Isopropyl alcohol | NG | G |
| Methyl ethyl ketone | NG | G |
| Trichloroethylene/methyl ethyl ketone | G | G |

*Mixing ratio by weight

What is claimed is:

1. In a rinse treatment of a substrate from which a patterned photoresist layer has been removed with a remover solution, the improvement which comprises:
rinsing the substrate with a nonaqueous rinse solvent which is essentially composed of an ether compound represented by the general formula

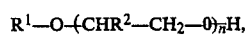

wherein $R^1$ is an alkyl group having 1 to 4 carbon atoms, $R^2$ is a hydrogen atom or a methyl group and n is 2 or 3.

2. The improvement according to claim 1 wherein the ether compound is selected from the group consisting of diethyleneglycol monomethyl ether, diethyleneglycol monoethyl ether, diethyleneglycol monobutyl ether, dipropyleneglycol monomethyl ether, dipropyleneglycol monoethyl ether, triethyleneglycol monomethyl ether, triethyleneglycol monoethyl ether and tripropyleneglycol monomethyl ether.

3. In a rinse treatment of a substrate from which a patterned photoresist layer has been removed with a remover solution, the improvement comprising rinsing the substrate with a nonaqueous solution consisting essentially of an ether compound of the general formula $$R^1\!-\!O\!-\!(CHR^2\!-\!CH_2\!-\!O)_{\overline{n}}H$$

wherein $R^1$ is an alkyl group having 1 to 4 carbon atoms, $R^2$ is a hydrogen atom or methyl group and n is 2 or 3; and an aliphatic amine compound represented by the general formula $$NR_3^3,$$

in which each $R^3$ is, independently from the others, a hydrogen atom, alkyl group of hydroxyalkyl group, at least one of these $R^3$ groups being a hydroxyalkyl group.

4. The improvement according to claim 3 wherein the aliphatic amine compound is selected from the group consisting of monoethanol amine, butyl monoethanol amine, ethyl diethanol amine and triisopropanol amine.

5. The improvement according to claim 3 wherein the amount of the aliphatic amine compound in the rinse solvent does not exceed 15% by weight when the patterned photoresist layer is formed of a negative-working photoresist composition.

6. The improvement according to claim 3 wherein the amount of the aliphatic amine compound in the rinse solvent does not exceed 50% by weight when the patterned photoresist layer is formed of a positive-working photoresist composition.

* * * * *